(12) United States Patent
Feinstein

(10) Patent No.: US 8,209,859 B2
(45) Date of Patent: Jul. 3, 2012

(54) TECHNIQUES FOR DIRECT ENCASEMENT OF CIRCUIT BOARD STRUCTURES

(75) Inventor: Louis H. Feinstein, Sharon, MA (US)

(73) Assignee: Textron Systems Corporation, Wilmington, MA (US)

( * ) Notice: Subject to any disclaimer, the term of this patent is extended or adjusted under 35 U.S.C. 154(b) by 1079 days.

(21) Appl. No.: 12/123,733

(22) Filed: May 20, 2008

(65) Prior Publication Data

US 2009/0035890 A1 Feb. 5, 2009

Related U.S. Application Data

(60) Provisional application No. 60/952,944, filed on Jul. 31, 2007.

(51) Int. Cl.
*H05K 3/30* (2006.01)
(52) U.S. Cl. ............... 29/841; 29/720; 29/832; 438/127
(58) Field of Classification Search .................. 257/784, 257/787, 790; 438/106, 112, 617, 674, 127; 29/832, 833, 840, 841, 709, 720, 739
See application file for complete search history.

(56) References Cited

U.S. PATENT DOCUMENTS

| | | | |
|---|---|---|---|
| 5,393,573 A | 2/1995 | MacKay | |
| 5,656,830 A * | 8/1997 | Zechman | 257/790 |
| 5,759,730 A | 6/1998 | Hermansen et al. | |
| 6,361,823 B1 | 3/2002 | Bokisa et al. | |
| 6,720,499 B2 | 4/2004 | Bokisa et al. | |
| 6,860,981 B2 | 3/2005 | Schetty, III et al. | |
| 7,037,833 B2 * | 5/2006 | Hasei | 438/674 |
| 7,259,455 B2 * | 8/2007 | Seto | 257/787 |
| 7,391,116 B2 | 6/2008 | Chen et al. | |
| 7,396,703 B1 | 7/2008 | Lin et al. | |

OTHER PUBLICATIONS

International Search Report from PCT/US2008/064230, mailed on Aug. 21, 2008.
Written Opinion from PCT/US2008/064230, mailed on Aug. 21, 2008.

* cited by examiner

*Primary Examiner* — Donghai D. Nguyen
(74) *Attorney, Agent, or Firm* — BainwoodHuang

(57) ABSTRACT

A technique for processing an electronic apparatus (e.g., manufacturing an assembled circuit board, treating an assembled circuit board, etc.) involves applying encasement material to an area of the circuit board assembly while leaving at least a portion of the circuit board assembly exposed. The technique further involves causing the applied encasement material to harden (e.g., heating the encasement material in a curing oven, applying radiation, providing a chemical catalyst, etc.). Application and hardening of the encasement material may take place shortly after circuit board assembly (e.g., by automated equipment at a manufacturing facility in order to treat newly assembled boards) or at some later time in the field (e.g., by a technician servicing a legacy board).

13 Claims, 6 Drawing Sheets

200

```
┌─────────────────────────────────────────────────────┐
│ MOUNT A SET OF CIRCUIT BOARD COMPONENTS TO A PRINTED CIRCUIT │
│ BOARD TO FORM A CIRCUIT BOARD ASSEMBLY              │
└─────────────────────────────────────────────────────┘ ～202
                         │
                         ▼
┌─────────────────────────────────────────────────────┐
│ APPLY ENCASEMENT MATERIAL TO AN AREA OF THE CIRCUIT BOARD │
│ ASSEMBLY WHILE LEAVING AT LEAST A PORTION OF THE CIRCUIT BOARD │
│ ASSEMBLY EXPOSED (E.G., BASED ON A MAPPING FROM A DATABASE OR │
│ PHYSICAL MAP, PROVIDE DIRECT ENCASEMENT/SELECTIVE   │
│ ENCAPSULATION TO PRE-SELECTED SURFACES OF THE CIRCUIT BOARD │
│ ASSEMBLY USING DIELECTRIC MATERIAL WITH CLOSELY MATCHING CTE) │
└─────────────────────────────────────────────────────┘ ～204
                         │
                         ▼
┌─────────────────────────────────────────────────────┐
│ CAUSE THE APPLIED ENCASEMENT MATERIAL TO HARDEN (E.G. CURE THE │
│ MATERIAL TO FORM DISCRETE SECTIONS WHICH PROTECT THE │
│ SURFACES AGAINST METALLIC WHISKER GROWTH)           │
└─────────────────────────────────────────────────────┘ ～206
```

TECHNIQUES FOR DIRECT ENCASEMENT OF CIRCUIT BOARD STRUCTURES

CROSS REFERENCE TO RELATED APPLICATIONS

This application claims the benefit of U.S. Provisional Patent Application No. 60/952,944 filed on Jul. 31, 2007, entitled "SELECTIVE ENCAPSULATION PROCESS FOR METALLIC WHISKER MITIGATION IN CIRCUIT ASSEMBLIES", the contents and teachings of which are hereby incorporated by reference in their entirety.

BACKGROUND

A typical assembled circuit board includes a printed circuit board and multiple circuit board components (e.g., integrated circuit (IC) packages, discrete components, connectors, etc.) which are solder mounted to the printed circuit board. Conventional solder mounting approaches include pin-in-hole (through-hole) soldering and surface mount technology (SMT) soldering.

There are different types of solder for mounting components to printed circuit boards. Although tin-lead (Sn—Pb) solders are the most common, manufacturers are moving away from lead-based (Pb-based) solders toward lead-free (Pb-free) solders due to environmental concerns and stricter government regulations. Pure tin (Sn) is an example of a Pb-free solder currently used by manufacturers.

Unfortunately, Pb-free finishes are susceptible to the spontaneous growth of "tin whiskers" or more generally "metallic whiskers" (i.e., metallic crystal structures). Such growths can cause electrical failures ranging from parametric deviations to catastrophic short circuits. Additionally, such growths may physically interfere with circuit board operation such as contaminate sensitive optical surfaces and hinder the movement of Micro-Electro Mechanical Systems (MEMS) devices.

Although metallic whiskers have been studied and reported for decades, the mechanism behind their growth is not well understood, and they remain a potential reliability hazard. Furthermore, the growing number of piece parts with pure tin finishes means there are more opportunities for metallic whiskers to grow and to produce failures.

One conventional approach to addressing the growth of metallic whiskers is referred to as "hot-solder dipping". Hot-solder dipping involves dipping the leads of circuit components into molten Sn—Pb solder. Such replating of the leads reduces the amount of lead having a whisker-prone metallic plating composition and thus tends to reduce the incidence of metallic whisker growth.

Another conventional approach to addressing the growth of metallic whiskers is referred to as "conformal coating". Conformal coating involves coating the entire assembled circuit board (e.g., a populated circuit board that has been built and initially tested) with an epoxy material. The epoxy material reduces metallic whisker formation as well as provides protection against moisture, dust, corrosion, etc.

SUMMARY

Unfortunately, there are deficiencies to the above-described conventional approaches to addressing the growth of metallic whiskers. For example, hot-solder dipping is undesirable for multiple reasons including its relatively high cost and its tendency to induce latent defects into a printed circuit assembly. The hot-solder dipping process can result in contamination and/or de-lamination of the components which may not be detectable during initial testing, but becomes responsible for failures later during the operation of the assembled circuit board. Additionally, solder joint fractures can arise due to mismatches of the thermal expansion characteristics (coefficient of thermal expansion or CTE) of the materials.

Furthermore, conformal coating is also expensive and may undesirably introduce parasitic effects into the circuit due for example to the use of high-dielectric coating materials. These may interfere with normal circuit operation, especially operation of high-speed and high-frequency electronic components and signals (such as radio frequency (RF) components/signals) that are sensitive to such parasitic effects.

In contrast to the above-described conventional approaches to addressing the growth of metallic whiskers, improved techniques involve the application of encasement material to discrete areas (e.g., predefined locations) of a circuit board assembly. The applied encasement material (e.g., a curable dielectric material which is both dielectrically neutral and CTE matched) is able to provide a physical barrier between adjacent metallic surfaces that could otherwise be susceptible to electrical failure due to metallic whisker growth. Such material provides robust and reliable metallic whisker prevention/mitigation. Moreover, even if metallic whisker growth is present, the applied encasement material is able to retain the metallic whiskers in place thus preventing the metallic whiskers from breaking free during operation of the circuit board assembly. Furthermore, such techniques alleviate the need for conformal coating or, in more-difficult settings, can be used in conjunction with conformal coating for enhanced metallic whisker growth mitigation.

One embodiment is directed to a method for processing an electronic apparatus (e.g., manufacturing an assembled circuit board, treating an assembled circuit board, etc.). The method includes applying encasement material to an area of a circuit board assembly while leaving at least a portion of the circuit board assembly exposed. The method further includes causing the applied encasement material to harden (e.g., heating the encasement material in a curing oven, applying radiation, providing a chemical catalyst, etc.). Application and hardening of the encasement material may take place shortly after circuit board assembly (e.g., by automated equipment at a manufacturing facility in order to treat newly assembled boards) or at some later time in the field (e.g., by a technician servicing a legacy board).

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

DETAILED DESCRIPTION

Improved techniques involve the application of encasement material to discrete areas (e.g., predefined locations) of a circuit board assembly. The applied encasement material (e.g., a curable dielectric material which is both dielectrically neutral and CTE matched) is able to provide a physical barrier between adjacent metallic surfaces that could otherwise be susceptible to electrical failure due to metallic whisker growth. Such material provides robust and reliable metallic whisker prevention/mitigation. Moreover, even if metallic whisker growth does occur, the applied encasement material is able to retain the metallic whiskers in place therefore preventing the metallic whiskers from breaking free during operation of the circuit board assembly. Additionally, such techniques alleviate the need for a conformal coating process or, in more-difficult settings, are capable of being used in combination with conformal coating for enhanced metallic whisker growth mitigation.

Figure 1:
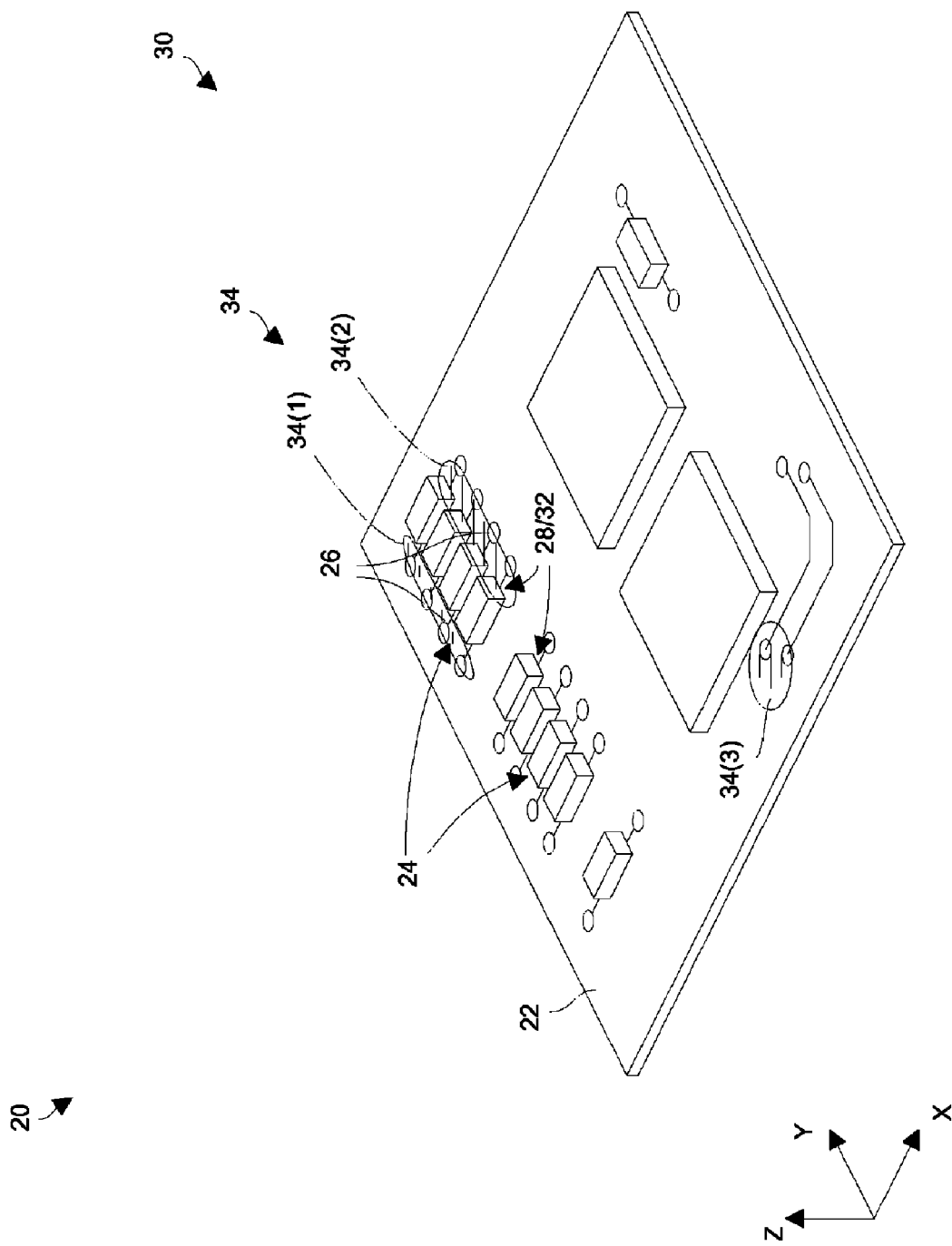
FIG. 1 is a perspective view of an electronic apparatus which includes a circuit board assembly and encasement material applied to multiple areas of the circuit board assembly while other areas are left exposed.

FIG. 1 shows an electronic apparatus 20 which enjoys protection against metallic whisker growth due to encasement material which is applied to discrete areas. The electronic apparatus 20 includes a printed circuit board 22, a set of circuit board components 24, and encasement material 26. At least some of the circuit board components 24 (e.g., ICs, discrete components, connectors, etc.) mount to the printed circuit board 22 via solder joints 28 during an assembly process thus forming a circuit board assembly 30.

In some situations, the solder joints 28 may include lead, e.g., Sn—Pb solder. In other situations, the solder joints 28 may be lead free, e.g., pure tin solder, and thus be more susceptible to metallic whisker growth. Either way, it should be understood that the circuit board assembly 30 may include metallic surfaces 32 which are potentially vulnerable to a variety of influences leading to an electrical failure if allowed to go untreated (e.g., moisture, dust collection, corrosion, etc.).

Fortunately, the encasement material 26 is directly applied to specific designated areas of the circuit board assembly 30 to encase particular structures of the circuit board assembly 30 while leaving other portions of the circuit board assembly 30 uncovered. In particular, the encasement material 26 provides a physical dielectric barrier between adjacent metallic surfaces at these areas. Such a barrier inhibits growth of metallic whiskers that could otherwise cause an electrical failure. A suitable substance for the encasement material 26 is underfill which is typically deposited between a flip chip device and the substrate which electrically and mechanically connects the flip chip device to printed circuit boards. Such dielectric encapsulant material has a well-matched CTE to prevent thermal expansion mismatch difficulties.

Additionally, even if metallic whisker growth does occur at areas treated with the encasement material 26, the applied encasement material is constructed and arranged to hold the metallic whiskers in place. Accordingly, during operation of the circuit board assembly 30, any metallic whiskers that are present at these areas will be restrained from breaking free and from causing an electrical failure.

Furthermore, it should be understood that the at least some portions of the circuit board assembly 30 remain uncovered. For example, if the encasement material 26 is applied only the areas containing exposed metallic surfaces or only to problematic areas where metallic surfaces are extremely close together, the remainder of the circuit board assembly is thus allowed to go untreated with the encasement material 26. Such limited application of the encasement material 26 may be particularly desirable in situations where component manufacturer give tight heat tolerances to their components. For instance, the tops of certain IC packages may be purposefully left untreated to enable the IC packages to make critical thermal contact with heat sinks, to remain exposed to laminar air flow for robust heat dissipation, and so on.

In some arrangements, the encasement material 26 is a curable dielectric material which is both dielectrically neutral and CTE matched to surrounding structures of the circuit board assembly. As a result, once the encasement material 26 has cured, the encasement material 26 provides a hard, durable, insulating covering over the otherwise exposed metallic surfaces 32. Additionally, due to its dielectrically neutral and RF friendly characteristics, the cured encasement material 26 does not degrade the RF and/or high-speed signaling behaviors of the electronic apparatus 20. Furthermore, due to its closely matched CTE, the mechanical properties of the encasement material 26 change in the same manner as the surrounding structures across different temperatures thus preventing the encasement material 26 from becoming a source of undesired mechanical stresses. Underfill encapsulants such as particular Hysol® products and similar substances are suitable for use as the encasement material 26.

It should be understood that the encasement material 26 allows a user to selectively encase particular structures of the circuit board assembly 30 with practically pin-point accuracy (e.g., direct encasement of the contact areas of adjacent parts). Each area of applied encasement material 26 may cover a single metallic structure, or multiple metallic structures. As illustrated in FIG. 1, the cured encasement material 26 forms coverings 34(1), 34(2), 34(3), . . . (collectively, coverings 34) which are discrete from each other. Due to the dielectric properties of the coverings 34, each covering is capable of encasing multiple electrical contacts 36 which are constructed and arranged to independently carry respective electrical signals. Further details will now be provided with reference to FIGS. 2 through 4.

Figure 2:
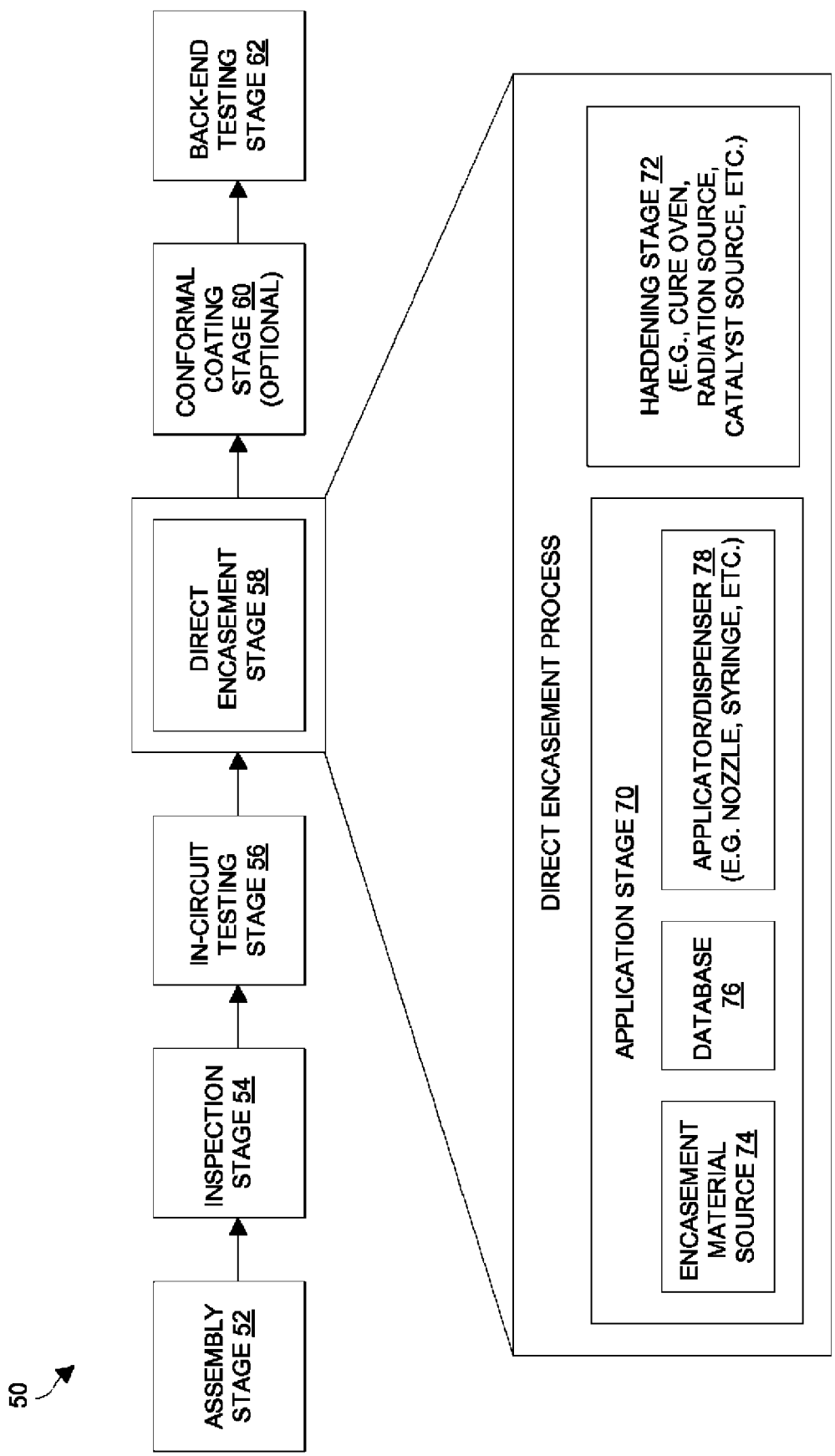
FIG. 2 is a block diagram of a system for manufacturing/treating the electronic apparatus of FIG. 1.
Figure 3:
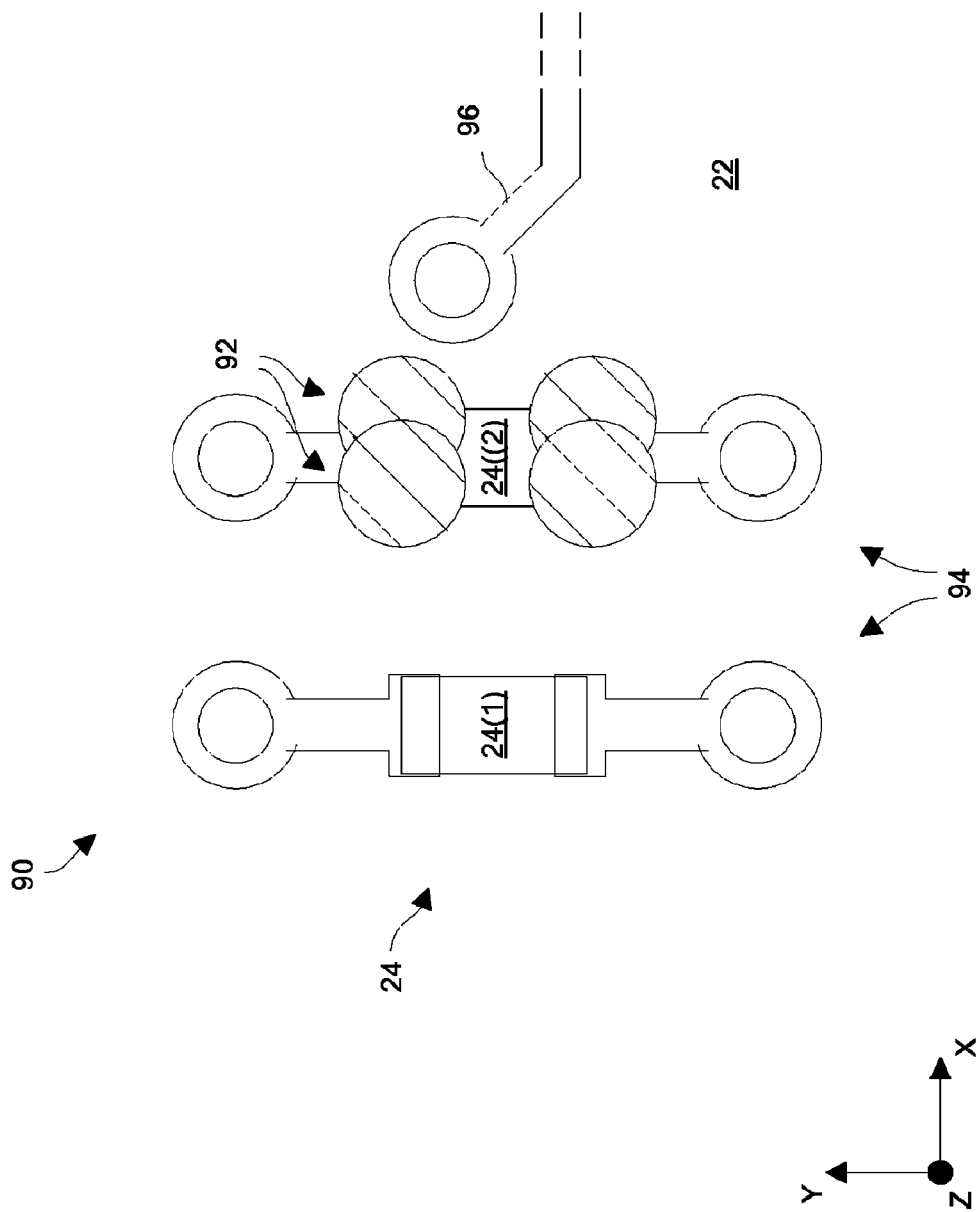
FIG. 3 is a top view of a portion of the electronic apparatus of FIG. 1 with identified locations to receive encasement material.
Figure 4:
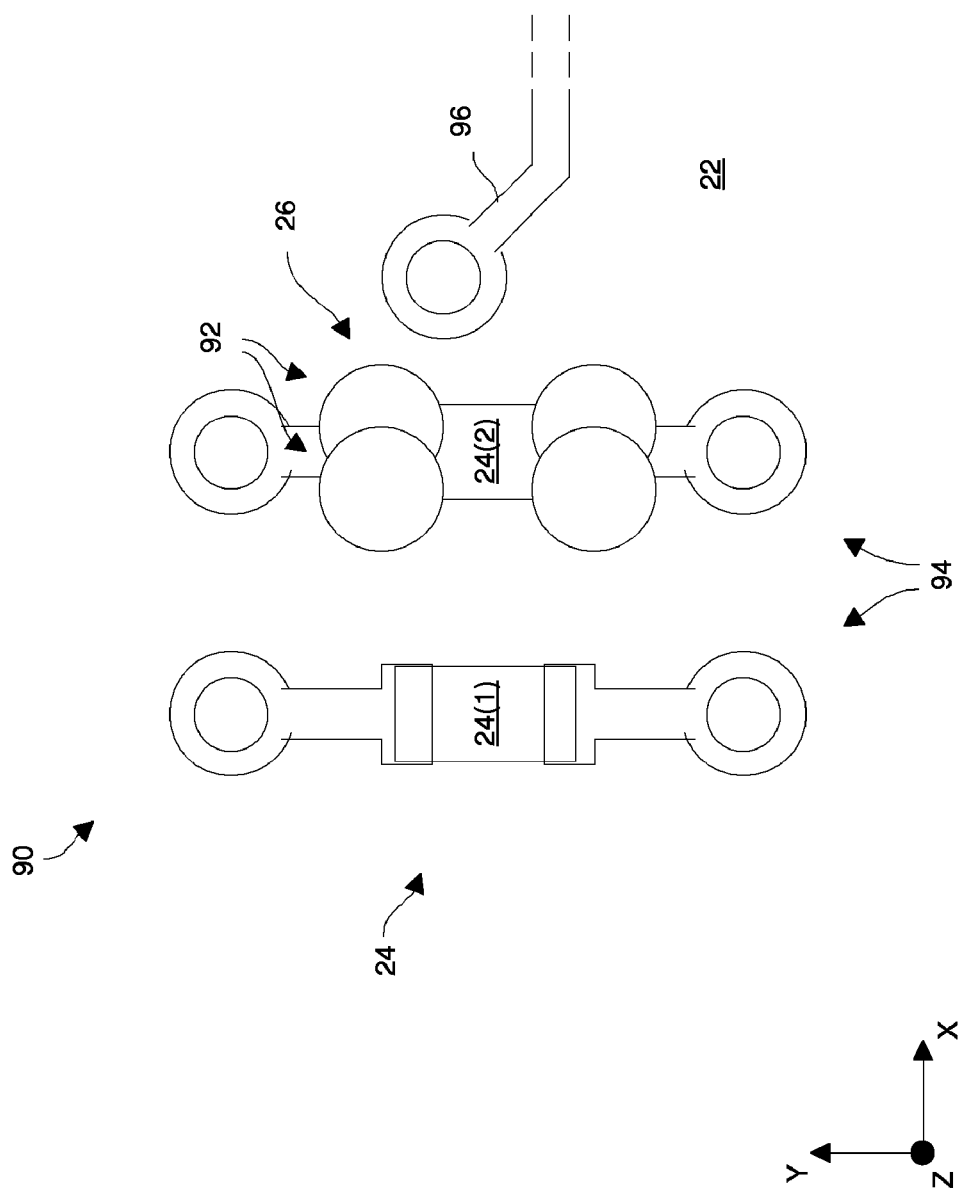
FIG. 4 is the top view of the portion of the electronic apparatus of FIG. 3 with the encasement material applied to the identified locations.

FIG. 2 shows a processing system 50 for manufacturing/treating the electronic apparatus 20. FIG. 3 is a top view of a portion 90 of the electronic apparatus 20 with identified locations 92 to receive the encasement material 26. FIG. 4 is a top view of the portion 90 of the electronic apparatus 20 with the encasement material 26 precisely applied to the identified locations 92.

As shown in FIG. 2, the processing system 50 includes an assembly stage 52, an inspection stage 54, an in-circuit testing stage 56, a direct encasement stage 58, a conformal coating stage 60, and a back-end testing stage 62. Although these various stages are illustrated in a pipeline configuration, it should be understood that the stages may reside in different assembly lines, facilities and/or companies.

At the assembly stage 52, equipment mounts the various components 24 to the printed circuit boards 22 to form circuit board assemblies 30. By way of example only, FIG. 3 shows two circuit board components 24(1), 24(2) and the PCB structures 94 to which they mount. Also by way of example, a signal trace 96 is shown close to the component 24(2) thus making the component 24(2) particularly problematic with respect to metallic whiskers. In some arrangements, the assembly stage employs surface mount technology (SMT), e.g., spreading of solder paste, distribution of parts using pick and place equipment, etc. In other arrangements, other mounting techniques are employed, e.g., wave soldering, press-fit, and so on.

At the inspection stage 54, equipment inspects the circuit board assemblies 30. In particular, the equipment confirms whether the components 24 are in their proper soldering locations (e.g., that none are missing) and that they are oriented properly (e.g., that none are improperly mounted to the circuit board 22).

At the in-circuit testing stage 56, equipment carries out initial testing of the circuit board assemblies 30. In some arrangements, the equipment probes certain conductive pads to confirm proper electrical connectivity among other things.

At the direct encasement stage 58, equipment applies the encasement material 26 to the circuit board assemblies 30, and then causes the encasement material 26 to harden (also see FIG. 4). In some arrangements, the hardened portions of encasement material 26 are substantially 3 mils in thickness or greater. In other arrangements, the hardened portions of encasement material 26 are substantially 2 mils in thickness or greater. Further details of the direct encasement stage 58 will be provided shortly.

At the conformal coating stage 60, equipment provides a conformal coating to the circuit board assemblies 30. The conformal coating is constructed and arranged to provide an overall protective coating which covers the circuit board assemblies 30 in their entirety.

At the back-end testing stage 62, equipment substantively tests the circuit board assemblies 30 prior to releasing the circuit board assemblies 30 to users. In some arrangements, each electronic apparatus 20 is powered on and activated to confirm proper operation. As part of such testing, each electronic apparatus 20 may be put through a variety of different environments, e.g., electric margin testing, shake/vibration testing, heat/cold testing, etc.

It should be understood that some of the above-described stages are optional. For example, the conformal coating stage 60 may be eliminated in order to avoid certain undesirable effects such as its high associated cost, interference with high-speed and high-frequency electronics, etc.

As further shown in FIG. 2, the direct encasement stage 58 includes an application stage 70 and a hardening stage 72. The application stage 70 includes an encasement material source 74, a database 76, and an applicator/dispenser 78. The encasement material source 74 provides the encasement material 26 to the applicator/dispenser 78. The database 76 stores database entries representing coordinates (e.g., X-Y coordinates) of the circuit board assembly locations 92 on which to apply the encasement material 26 (also see FIG. 3). The applicator/dispenser 78 obtains the encasement material 26 from the source 74 and deposits the encasement material 26 onto the circuit board assembly locations 92 based on the entries from the database 76 (also see FIGS. 3 and 4) while leaving at least a portion of the circuit board assembly 30 exposed.

The encasement material source 74 preferably stores the encasement material 26 in a ready-to-apply liquid form, and the applicator/dispenser 78 directs the encasement material 26 onto the locations 92. In some arrangements, the applicator/dispenser 78 includes a robotically controlled, heated nozzle (e.g., a material jet, a rotary pump, and/or a positive displacement head) through which the encasement material 26 is applied with high precision. For this operation, a machine which normally dispenses SMT adhesive is capable of being loaded with the encasement material 26 and then configured to dispense/jet the encasement material 26 in lieu of the adhesive to pixel-precise surfaces at the locations 92 based on the information in the database 76.

The hardening stage 72 of the direct encasement stage 58 preferably includes equipment which cures the encasement material 26 after it is applied to the circuit board assemblies 30. In some arrangements, the hardening stage 72 includes a cure oven which is adapted to raise the temperature of the applied encasement material 26 to a predefined cure temperature (e.g., 130 degrees Fahrenheit, 130-195 degrees Celsius, etc.) for a predetermined amount of time (e.g., 4-5 minutes). In some arrangements, the hardening stage 72 applies U-V light and/or a catalyst which cures the applied encasement material 26. Other hardening mechanisms are suitable for use as well (e.g., moderately heated dry air, other types of radiation, etc.).

As shown in FIG. 3, the identified locations 92 are represented in an X-Y coordinate system as pixels and stored in the database 76. Accordingly, comprehensive application of the encasement material 26 to a particular surface of a circuit board assembly 30 may involve dispensing the encasement material 26 to adjacent pixels which enables the encasement material 26 to provide extending coverage across a multi-pixel area. Moreover, in some situations, the same pixel may be hit multiple times to enable the encasement material 26 to accumulate and slightly disperse (e.g., for overlapping coverage and robust encasement) over particular locations 92.

As shown in FIG. 4, the applied encasement material 26 tends to adhere to the locations 92 with pin-point precision. As a result, the encasement material 26 may be sparingly applied only to pre-selected surfaces which benefit from the presence of the encasement material 26. Such pre-selected surfaces preferably include exposed metallic surfaces such as component pads, plated through-holes (PTHs), and signal traces.

Other locations may remain free of the encasement material 26 (e.g., optical structures, MEMS structures, etc.) thus avoiding interference with these other locations and conserving material. For example, as shown in FIGS. 3 and 4, the bodies of the components 24 are purposefully left significantly untreated. In some situations, this aspect provides a significant advantage over conventional conformal coating since localization of the encasement material 26 to the component contact areas maintains/preserves the thermal interfaces of the component packages. Further details will now be provided with reference to FIG. 5.

Figure 5:
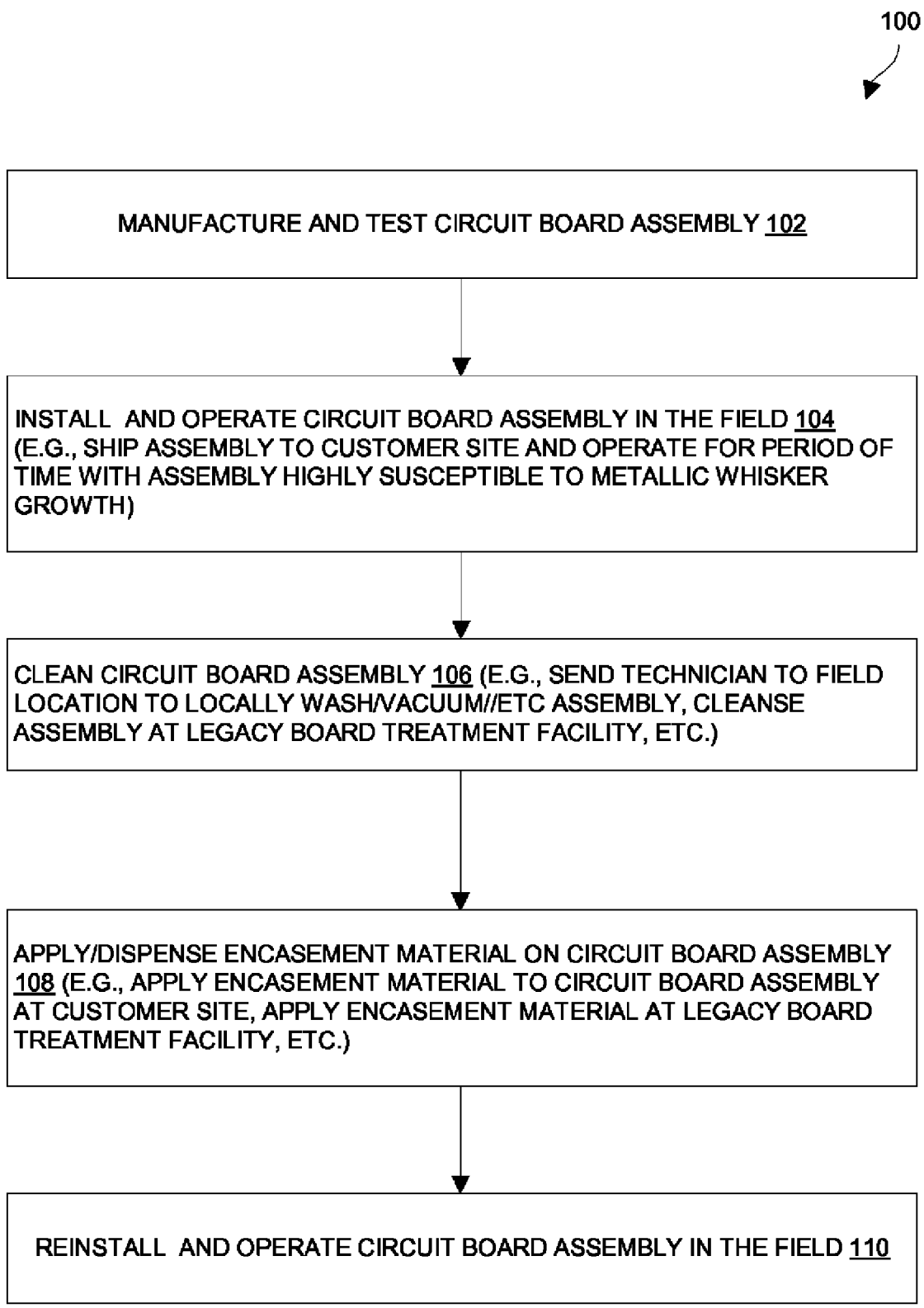
FIG. 5 is a block diagram of a process for treating a legacy circuit board assembly using the encasement material.

FIG. 5 shows a process 100 for treating a circuit board assembly 30 which has been operating in the field prior to receiving the encasement material 26. Such a process 100 is appropriate for legacy equipment.

In step 102 of the process 100, the circuit board assembly 30 is manufactured and tested (e.g., by a supplier) but free of any treatment with the encasement material 26. At this point, the circuit board assembly 30 may be highly susceptible to metallic whisker growth if the supplier has not employed any means of mitigation such as conventional hot soldering dipping or conventional conformal coating.

In step 104, the circuit board assembly 30 is installed and operated in the field. Here, the circuit board assembly 30 may have been shipped and activated at a customer site. Accordingly, some metallic whisker growth may have occurred.

In step 106, the circuit board assembly 30 is cleaned. In some arrangements, a field technician cleanses (e.g., washes, vacuums, etc.) the circuit board assembly 30 at the field location. This local treatment situation is acceptable if not much time has passed since deploying the circuit board assembly 30 and a visual inspection indicates metallic whisker growth, if any, to be minor. In other arrangements, the circuit board assembly 30 is brought to a treatment facility where it is cleansed. This transport situation is appropriate if the circuit board assembly 30 is expensive and/or if it has been determined that metallic whisker growth is significant.

In step 108, the encasement material 26 is applied to the circuit board assembly 30. In the field, the technician may apply the encasement material 26 to the circuit board assembly 30 by reviewing a map of designated locations 92 (e.g., visual marks on a physical map, also see FIGS. 3 and 4) of the circuit board assembly 30 and, based on the map, manually dispensing the encasement material 26 over exposed metallic surfaces at the locations 92 using an application tool (e.g., manually maneuvering a needle, a dropper, a syringe, etc.). The technician then causes the encasement material 26 to harden (e.g., by shining U-V light, activating a catalyst, applying heat, or simply allowing the material to naturally dry). In a treatment facility, automated robotic equipment or a technician may apply the encasement material 26 to the circuit board assembly 30 and harden the encasement material 26 in a similar manner or using high-tech machinery (e.g., a robotically controlled applicator/dispenser).

In step 110, the circuit board assembly 30 is reinstalled and operated in the field. At this point, the circuit board assembly 30 is now well-protected against metallic whisker growth. Further details will now be provided with reference to FIG. 6.

Figure 6:
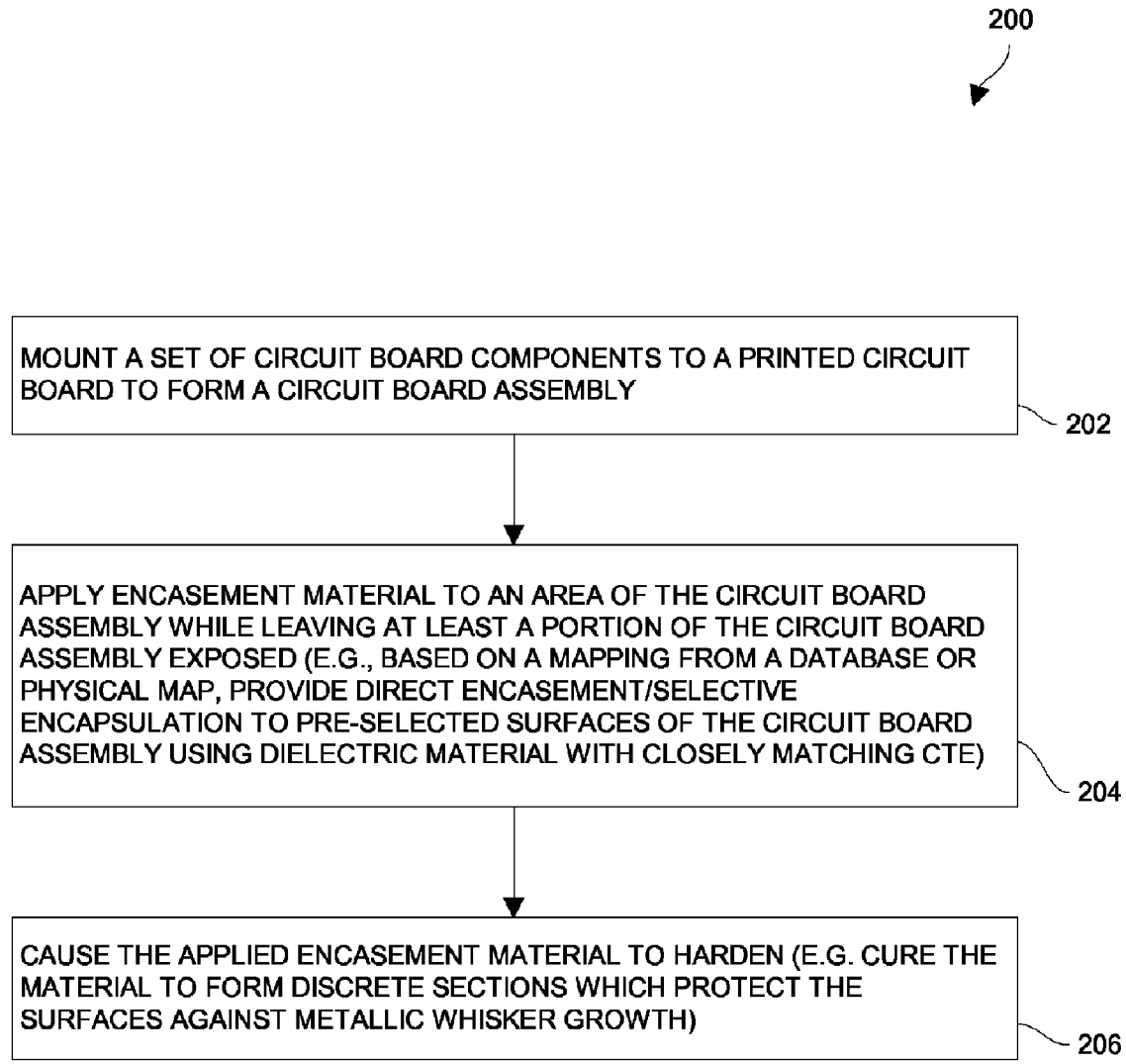
FIG. 6 is a flowchart of a procedure which relates to the block diagrams of FIGS. 2 and 5.

FIG. 6 is a flowchart of a procedure 200 which relates to the processing diagrams of FIGS. 2 and 5. In step 202, the circuit board components 24 are mounted to the printed circuit board 22 using an assembly process (e.g., SMT, wave soldering, press fit, etc.). The combination of the printed circuit board 22 and the circuit board components 24 forms a circuit board assembly 30 (also see FIG. 1).

In step 204, the encasement material 26 is applied to designated locations 92 of the circuit board assembly 30 while leaving at least a portion of the circuit board assembly 30 uncovered. In some arrangements, the encasement material 26 is applied through an applicator/dispenser 78 (FIG. 2) based on reference to a mapping of the designated locations 92 which correspond to metallic surfaces susceptible to metallic whisker growth (also see FIG. 3).

In step 206, the encasement material 26 is hardened to form separate individual coatings over the treated metallic surfaces. In some arrangements, the encasement material 26 is cured (e.g., by application of heat, a catalyst, radiation, etc.). Once the encasement material 26 has hardened, the dielectric and matching CTE properties of the encasement material 26 robustly and reliably protect the circuit board assembly 30 against metallic whiskers (also see FIG. 4).

As described above, improved techniques involve the application of encasement material 26 to discrete areas 92 of a circuit board assembly 30. The applied encasement material 26 is able to provide a physical barrier between adjacent metallic surfaces that could otherwise be susceptible to electrical failure due to metallic whisker growth. Such material provides robust and reliable metallic whisker prevention/mitigation. Moreover, even if metallic whisker growth is present, the applied encasement material 26 is able to retain the metallic whiskers in place thus preventing the metallic whiskers from breaking free during operation of the circuit board assembly 30. Furthermore, such techniques alleviate the need for conformal coating or, in more-difficult settings, can be used in conjunction with conformal coating for enhanced metallic whisker growth mitigation.

While various embodiments of the invention have been particularly shown and described, it will be understood by those skilled in the art that various changes in form and details may be made therein without departing from the spirit and scope of the invention as defined by the appended claims.

What is claimed is:

1. A method of processing an electronic apparatus, the method comprising:
    mounting a set of circuit board components to a printed circuit board to form a circuit board assembly;
    applying encasement material to an area of the circuit board assembly while leaving at least a portion of the circuit board assembly exposed; and
    causing the applied encasement material to harden;
    wherein applying the encasement material to the area of the circuit board assembly includes:
        substantially encasing a pre-selected set of surfaces of the circuit board assembly with dielectric material as the encasement material;
    wherein the pre-selected set of surfaces has a coefficient of thermal expansion (CTE); and wherein causing the applied encasement material to harden includes:
        curing the dielectric material, the cured dielectric material having a CTE which is substantially equal to the CTE of the pre-selected set of surfaces;
    wherein substantially encasing the pre selected set of surfaces of the circuit board assembly with dielectric material includes:
        covering discrete exposed metallic surfaces of the circuit board assembly with the dielectric material; and
    wherein covering the discrete exposed metallic surfaces of the circuit board assembly with the dielectric material includes:
        identifying an exposed metallic surface based on a set of coordinates which maps a side of the circuit board assembly; and
        maneuvering an applicator over the identified exposed metallic surface and providing the dielectric material from the applicator to the identified exposed metallic surface.

2. A method as in claim 1 wherein covering the discrete exposed metallic surfaces of the circuit board assembly with the dielectric material further includes:
    identifying another exposed metallic surface based on the set of coordinates which maps the side of the circuit board assembly; and
    maneuvering the applicator over the identified other exposed metallic surface and providing the dielectric material from the applicator to the identified other exposed metallic surface.

3. A method as in claim 2 wherein maneuvering the applicator and providing the dielectric material forms discrete sections of the dielectric material on different circuit board components mounted to the printed circuit board.

4. A method as in claim 2 wherein maneuvering the applicator and providing the dielectric material forms discrete sections of the dielectric material on different electrical contacts of a same circuit board component mounted to the printed circuit board.

5. A method as in claim 1 wherein identifying the exposed metallic surface based on the set of coordinates which maps the side of the circuit board assembly includes storing a database entry a database, the database entry representing the set of coordinates; and
    wherein maneuvering the applicator over the identified exposed metallic surface and providing the dielectric material from the applicator to the identified exposed metallic surface includes positioning a dispenser over the exposed metallic surface using robotic equipment based on the database entry.

6. A method as in claim 5, wherein the dispenser includes a heated nozzle through which the encasement material is applied;
wherein the identified exposed metallic surface includes a multi-pixel area;
wherein maneuvering the applicator over the identified exposed metallic surface and providing the dielectric material from the applicator to the identified exposed metallic surface further includes:
dispensing a dose of the encasement material to adjacent pixels of the multi-pixel area; and
wherein a pixel of the multi-pixel area receives a plurality of doses of encasement material, the plurality of doses being effective to enable the encasement material to accumulate and disperse in a neighborhood of the pixel;
wherein the method further comprises:
providing a conformal coating to the circuit board assembly using a conformal coating process which is separate and distinct from applying the encasement material and causing the applied encasement material to harden, the conformal coating being constructed and arranged to provide an overall protective coating which covers the circuit board assembly.

7. A method as in claim 1 wherein identifying the exposed metallic surface based on the set of coordinates which maps the side of the circuit board assembly includes placing a visual mark on a physical map of the circuit board assembly; and
wherein maneuvering the applicator over the identified exposed metallic surface and providing the dielectric material from the applicator to the identified exposed metallic surface includes manually positioning a dispenser over the exposed metallic surface based on a visual reference to the visual mark placed on the physical map.

8. A method as in claim 1 wherein curing the dielectric material includes:
within a curing oven, raising the temperature of the dielectric material, which substantially encases the pre-selected set of surfaces, to a predefined curing temperature for a predefined curing time.

9. A method as in claim 1 wherein substantially encasing the pre-selected set of surfaces of the circuit board assembly with dielectric material includes:
depositing the dielectric material with a thickness of substantially 2 mils.

10. A method as in claim 1 wherein substantially encasing the pre-selected set of surfaces of the circuit board assembly with dielectric material includes:
forming isolated coated regions of dielectric material, the formed isolated coated regions being separated from each other by exposed non-coated regions.

11. A method as in claim 1 wherein substantially encasing the pre-selected set of surfaces of the circuit board assembly with dielectric material includes:
leaving exposed surfaces of circuit board device packages substantially uncoated by the dielectric material.

12. A method as in claim 1, further comprising:
providing a conformal coating to the circuit board assembly using a conformal coating process which is separate and distinct from applying the encasement material and causing the applied encasement material to harden.

13. A method as in claim 12, wherein providing the conformal coating to the circuit board assembly includes:
applying, as the conformal coating, an overall protective coating which covers the circuit board assembly.

* * * * *